(12) United States Patent
Neuberth

(10) Patent No.: US 6,897,750 B2
(45) Date of Patent: May 24, 2005

(54) INTEGRAL PASSIVE SHIM SYSTEM FOR A MAGNETIC RESONANCE APPARATUS

(75) Inventor: Gerald Neuberth, Bruchsal (DE)

(73) Assignee: Bruker Biospin GmbH, Rheinstetten (DE)

( * ) Notice: Subject to any disclaimer, the term of this patent is extended or adjusted under 35 U.S.C. 154(b) by 65 days.

(21) Appl. No.: 10/108,500

(22) Filed: Mar. 29, 2002

(65) Prior Publication Data

US 2002/0140535 A1 Oct. 3, 2002

(30) Foreign Application Priority Data

Apr. 3, 2001 (DE) .......................................... 101 16 505

(51) Int. Cl.$^7$ ................................................ H01F 1/00
(52) U.S. Cl. ...................................... 335/296; 335/301
(58) Field of Search ............................... 335/296–302, 335/216; 324/252, 318–322

(56) References Cited

U.S. PATENT DOCUMENTS

| 4,698,611 | A | * | 10/1987 | Vermilyea .................. 335/298 |
| 4,879,538 | A | * | 11/1989 | Pausch ....................... 335/298 |
| 4,990,877 | A | | 2/1991 | Benesch |
| 5,463,363 | A | | 10/1995 | Ogawa |
| 5,532,597 | A | * | 7/1996 | McGinley et al. .......... 324/319 |
| 6,294,972 | B1 | | 9/2001 | Jesmanowicz et al. |

FOREIGN PATENT DOCUMENTS

GB           2 153 367         8/1985

* cited by examiner

Primary Examiner—Lincoln Donovan
(74) Attorney, Agent, or Firm—Paul Vincent

(57) ABSTRACT

In an arrangement for adjusting the spatial dependence of a magnetic field in a working volume of a main field magnet (19) by means of ferromagnetic field shaping elements (16), the field shaping elements (16) are formed from foils (1, 5, 7, 8) and/or sheet metals (10) having openings (2, 3) whose shape, position and size are selected such that the shape and the amount of the remaining ferromagnetic material produces a desired spatial dependence of the magnetic field in the working volume of the main field magnet for appropriate positioning of the foils (1, 5, 7, 8) and/or sheet metals (10) relative to the working volume of the main field magnet.

16 Claims, 5 Drawing Sheets

Fig. 6          PRIOR ART

INTEGRAL PASSIVE SHIM SYSTEM FOR A MAGNETIC RESONANCE APPARATUS

This application claims Paris Convention priority of DE 101 16 505.6 filed on Apr. 3, 2001 the complete disclosure of which is hereby incorporated by reference.

BACKGROUND OF THE INVENTION

The invention concerns an arrangement for adjusting the spatial dependence of a magnetic field in a working volume of a main field magnet using ferromagnetic field shaping elements.

An arrangement of this type is known from U.S. Pat. No. 4,990,877.

For magnetic resonance apparatus, an approximately spherical working volume is usually desired and realized in which the magnetic field should be as homogeneous as possible, i.e. the desired spatial dependence of the magnetic field should be a constant. For modern magnetic resonance apparatus which are used in medical diagnosis, the maximum admissible relative deviation of the magnetic field from its average value is typically less than 5 ppm (parts per million) in a working volume with a diameter of approximately half the diameter of the bore of the main field magnet. Initially, the precondition for such a precisely required spatial dependence of the magnetic field is a suitable geometric arrangement of the components of the main field magnet which produce the magnetic field, which can be theoretically calculated. However, in practice there are deviations from the ideal theoretical geometric arrangement of the components of the main field magnet due to mechanical tolerances during production of the main field magnet which can produce actual deviations from the desired constant magnetic field on the order of 1000 ppm.

All conventional embodiments for adjusting the spatial dependence of magnetic fields using ferromagnetic field shaping elements (also designated passive shim systems or homogenization means) use a plurality, typically more than one hundred, predetermined locations at which one or more ferromagnetic field shaping elements are mounted. The field shaping elements can e.g. be square sheet metal pieces which can be easily stacked on top of each other to be mounted at one of the predetermined locations. Particularly inexpensive types of field shaping elements are standard parts such as washers or nuts or screws made from magnetic steel. An unavoidable feature of these systems with a plurality of predetermined locations for the shims is that each of the predetermined locations must have devices for holding the ferromagnetic field shaping elements at the respective location, despite the presence of large magnetic forces. For this reason, all known means for adjusting the spatial dependence of magnetic fields using ferromagnetic field shaping elements have the disadvantage that a relatively large amount of volume is lost due to the retaining devices themselves and there are gaps between the field shaping elements which cannot be utilized. In order to reduce production costs, magnets for producing the highest magnetic fields (above 10T) for magnetic resonance spectroscopy have a tubular access to the working volume with a diameter of only a few cm. In such cases, conventional means for adjusting the spatial dependence of magnetic fields using ferromagnetic field shaping elements cannot be used since the space required is excessively large. A further disadvantage of these conventional means is that loading must be carried out manually and counting of the required field shaping elements is required for each of the numerous predetermined locations. Occupation errors are likely, the correction of which is time consuming. In U.S. Pat. No. 4,990,877, the main field magnet is part of a magnetic resonance apparatus and has a cylindrical bore for receiving a patient. The working volume of the main field magnet is thereby located in the center of the bore. A plurality of field shaping elements made from ferromagnetic material is mounted to the surface of the bore of the main field magnet. These field shaping elements can consist of soft-magnetic material, e.g. soft iron and are magnetized to a calculatable value, e.g. saturation magnetization, in the magnetic field of the main field magnet for influencing the spatial dependence of the magnetic field in the working volume. Realization of a suitable geometric arrangement of the field shaping elements permits adjustment to the desired spatially constant magnetic field. This process is usually carried out in three steps.

In an initial measuring step, the actual spatial dependence of the magnetic field in the working volume is measured. The geometric arrangement of the field shaping elements which is required for adjusting the desired spatial dependence is then calculated in a calculating step. Finally, this calculated geometric arrangement of the field shaping elements is realized in an "occupation step". The improved spatial dependence of the magnetic field can be iteratively optimized in further measuring, calculating and occupying steps.

The occupying step requires a suitable means for mounting the field shaping elements. Such means must meet several requirements. Since large magnetic forces act on the ferromagnetic field shaping elements in the background field of the main field magnet, a correspondingly stable anchoring of the field shaping elements must be ensured. Moreover, the position of the field shaping elements must be precisely fixed and reproducible in case of iterative optimizations. It is also important that the means requires as little space as possible since the space in the bore for additional components such as e.g. gradient coil systems and the patient would otherwise be inadmissibly reduced or a correspondingly larger and therefore considerably more expensive main field magnet would be required. In addition, handling of the means should be simple.

In view of these features of prior art, it is the object of the present invention to facilitate precise adjustment of the spatial dependence of the magnetic field in the working volume of a main field magnet using ferromagnetic field shaping elements to optimally reduce the volume lost through holding devices for the field shaping elements while preventing occupation errors.

SUMMARY OF THE INVENTION

This object is achieved in accordance with the invention in a surprisingly simple and effective manner in that the field shaping elements are formed from foils and/or sheet metals having openings with a shape, position and size selected such that the shape and amount of the remaining ferromagnetic material produces a desired spatial dependence of the magnetic field in the working volume of the main field magnet with appropriate positioning of the foils and/or sheet metals relative to the working volume of that main field magnet.

The openings in the foils and/or sheet metals required for the magnetic field correction can be of geometrically simple shapes, e.g. squares, circles, triangles, ellipses etc. or can even assume very bizarre and complex shapes. They can also be a combination of both shape types. These field shaping elements permit optimum utilization of space and therefore transfer of the effectivity of the ferromagnetic field shaping elements (shims). One is neither restricted to certain positions in rails with chambers nor to the size and shape of the shims. Consequently, the software can be driven with fine resolution for determining the cut-outs in the metal sheets and foils. This permits more precise field corrections. In contrast to the conventional passive and manual shim method, the desired field correction can always be carried out without occupation error. This clearly illustrates the reliability of this inventive passive field correction method.

When the main field magnet is part of a magnetic resonance (MR) apparatus, the magnetic field homogenized with the inventive means permits particularly precise investigations to be carried out.

When the field shaping elements are disposed substantially on cylindrical surfaces surrounding the working volume of the main field magnet, homogenization of the magnetic field is particularly easy. Moreover, free access to the working volume is ensured.

In a preferred embodiment, the field shaping elements are disposed on one or more supporting tubes which preferably have a thin wall and which surround the working volume of the main field magnet. The holders require much less space than the conventional means. The field shaping elements can be easily inserted into the room temperature bore of a nuclear magnetic magnet. The support tubes mainly provide mechanical stability to ensure that the thin sheet metals and foils do not sag and are mechanically fixed. This also permits a defined, reproducible positioning in the magnet system. Mounting of the sheet metals and foils can be effected e.g. via point-welding, positioning bolts or by screwing to the supporting tube.

An alternative embodiment is characterized in that the field shaping elements are self-supporting and surround the working volume of the main field magnet in their operating position. In contrast to prior art, no space is required for the field shaping element holders.

In an advantageous embodiment, the field shaping elements are constructed of bendable ferromagnetic foils and/or sheet metals. In this manner, the sheet metals or foils can be easily adjusted to the magnetic field correction requirements and to the spatial surroundings of the magnet system without substantial mechanical effort.

In a further advantageous embodiment, the field shaping elements are formed from rolled ferromagnetic foils and/or sheet metals. In this fashion, the sheet metals and foils can be disposed in a self-supporting fashion or can be mounted to a cylindrical surface of a support body in the magnet system. The sheet metals and foils can e.g. be rolled into tubes and simply be introduced into the magnet bore of a magnetic resonance apparatus.

In an advantageous embodiment, the field shaping elements have several layers. Due to the compact arrangement, only two fixing points are required (start and end of the sheet metals or foils). Several layers permit use of different geometrical shapes of the sheet metals and foils which are superposed and which can be rotated relative to each other for desired field corrections.

In a preferred further development, different layers of the field shaping elements are, in their operating position, disposed about the working volume of the main field magnet and disposed for relative mutual rotation in a fixable fashion. This permits continuous adjusting of the field dependence for each MR apparatus which is particularly advantageous since the winding paths and wire thickness of the main field magnet varies from MR apparatus to MR apparatus, due to production tolerances.

In a further advantageous embodiment, the field shaping elements are formed of segments of cylindrical shells. This facilitates use of sheet metals and foils. Mounting or clamping e.g. on an approximately cylindrical support tube is simplified. It is moreover possible to dispose different numbers of segment layers of sheet metals and foils on top of each other to obtain the desired field correction.

Further improvement of homogenization can be achieved when additional ferromagnetic shim elements are disposed in rails with guidances, about the working volume of the main field magnet together with field shaping elements formed from foils and/or sheet metals having suitable openings, wherein the shim elements are constructed and positioned such that, together with the field shaping elements, they produce the desired spatial dependence of the magnetic field in the working volume of the main field magnet.

In a preferred embodiment, the rails with guidances for the shim elements are disposed on the support tubes of the field shaping elements. These rails can be disposed on the approximately cylindrical supporting body or in the magnet bore at uniform separations for improving the homogenization of the magnetic field.

It is particularly advantageous when the rails with the guidances for the shim elements are disposed on the field shaping elements.

In a particularly preferred embodiment of the invention, only one single field shaping element is provided, formed in one piece of a foil and/or sheet metal having suitable openings. This therefore entails only one occupation step with one single element (sheet metal or foil) and does not require occupation with a plurality of field shaping elements along with their mechanical mounting. This simplifies the occupation step.

The object in accordance with the invention is also achieved by a method for producing an arrangement for adjusting the spatial dependence of a magnetic field wherein the openings in the foils and/or sheet metals of the ferromagnetic field shaping elements required for the desired field correction of the magnetic field generated in the working volume by the main field magnet, can be produced by means of program-controlled processing machines, in particular computer-controlled machine tools. This permits automation of the complete and reliable field correction process. The dependence of the magnetic field is analyzed via a computer, and the shape of the cut-outs in the sheet metals is determined by computer software and implemented by a computer-controlled machine tool. This is advantageous in that errors occurring in conventional passive magnetic field corrections, e.g. communication, typing or occupational errors of the field shaping elements are avoided. Moreover, reproducible precision of the field correction is possible via the computer-controlled machine tool.

In a preferred method variant, the openings in the foils and/or sheet metals of the ferromagnetic field shaping elements required for desired field correction of the magnetic field produced by the main field magnet in the working volume are produced by laser and/or water jet cutting means. This permits complex and complicated cut-out shapes of the sheet metals and foils with excellent precision.

A further preferred method variant is characterized in that the openings in the foils and/or sheet metals of the ferromagnetic field shaping elements required for the desired field correction of the magnetic field produced in the working volume by the main field magnet, are produced in flat foils and/or sheet metals. This is advantageous in that production of the cut-outs is possible by simple means and methods. The sheet metals and foils can be subsequently shaped, e.g. in the form of a cylinder.

In an alternative method variant, the openings in the foils and/or sheet metals of the ferromagnetic field shaping elements which are required for desired field correction of the magnetic field produced in the working volume by the main field magnet are produced from rolled foils and/or sheet metals. This permits very precise and exact cutting out of the desired cut-outs which increases accuracy of the cut-outs and therefore effectivity. The sheet metals and foils are e.g. rolled into a tube or into approximately cylindrical segments and subsequently cut out.

In accordance with the invention, the main magnetic field can initially be produced in any fashion, e.g. by permanent magnets, resistive or superconducting magnet coils with iron pole shoes or resistive or superconducting "air coils" or combinations thereof.

It is, however, particularly preferred when the main magnet comprises a superconducting short-circuited main coil. Such magnets are largely standard in tomography systems and are nearly always used in analytical MR apparatus. They guarantee good homogeneity and most importantly, stability over time and are not dependent on the quality of a power unit.

In this case it is particularly preferred when the number, strength and positions of the shims are calculated such that they, in their entirety, are substantially uncoupled from the main coil.

Optimum compensation or elimination of the field drift is achieved when all individual field shaping elements have as uniform a temperature as possible. This can be improved by thermally connecting the field shaping elements.

Further advantages can be extracted from the drawing and the description. The features mentioned above and below can be used in accordance with the invention either individually or collectively in any arbitrary combination. The embodiments shown and described are not to be understood as exhaustive enumeration but have exemplary character for describing the invention. The invention is not only suited for main field magnets with cylindrical bore but also for pole shoe magnets having the working volume located between two pole shoes of an electric or permanent magnet system.

The invention is shown in the drawings and is explained in more detail by means of embodiments.

DESCRIPTION OF THE PREFERRED EMBODIMENT

Figure 6:
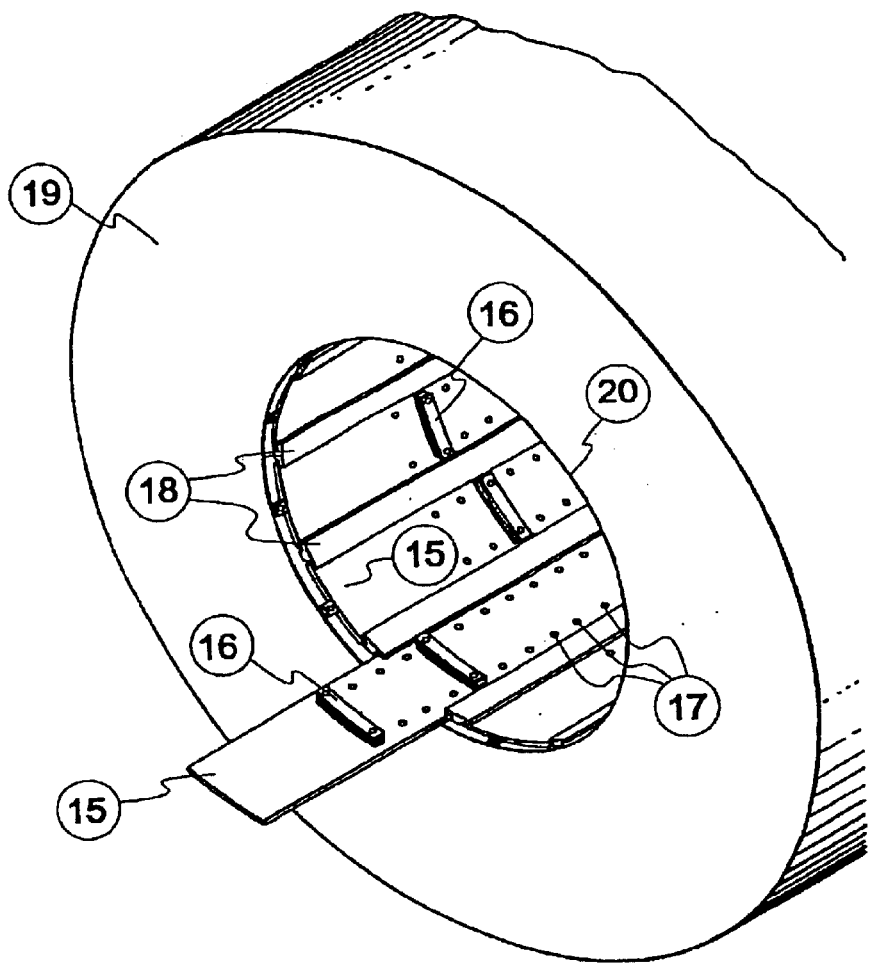
FIG. 6 schematically shows the main magnet of a magnetic resonance apparatus with a passive homogenization means.

FIG. 6 schematically shows a superconducting main magnet 19 of a nuclear magnetic resonance apparatus with axial room temperature bore 20 according to prior art. The inner wall of the room temperature bore 20 has a plurality of axial guidances 18 into which rails 15 can be inserted. Ferromagnetic field shaping elements 16 in the form of plates of different strengths can be stacked on these rails 15 at various, precisely defined positions 17. The rails 15 are inserted into the guidances 18 and are fastened. These guiding rails can also be part of a support tube, of two substantially flat shim plate supports of a pole shoe magnet, or of a support plate for a one-sided main magnet 19.

Figure 7:
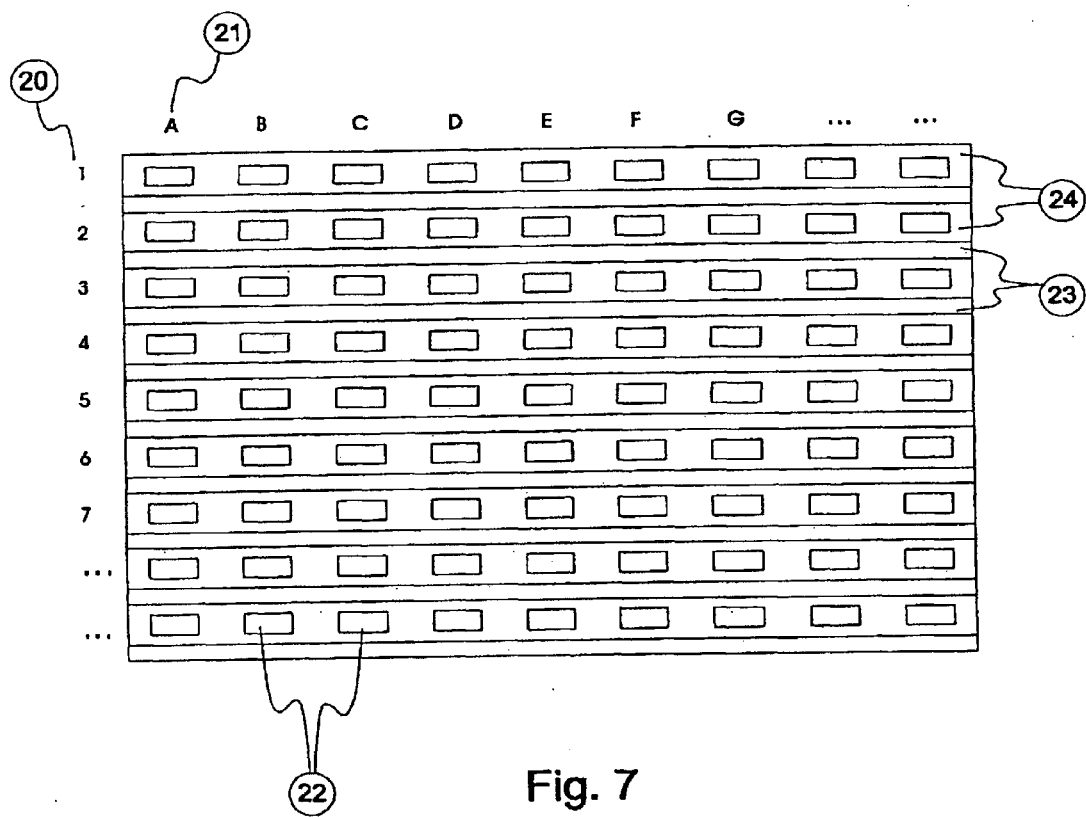
FIG. 7 schematically shows the development of a conventional passive shim system for magnets of a nuclear magnetic resonance apparatus.

FIG. 7 schematically shows the planar projection of a standard passive shim apparatus for conventional nuclear magnetic resonance magnets. The shim rails 24 are located in the horizontal guidances 23. The shim rails 24 have defined possible positions, also called chambers (e.g. A1, D4, F6 etc.) for the ferromagnetic shim plates 22. The shape and configuration of these shim plates 22 are defined by their mounting in the positions provided in the rail 24 and must fit into the chambers. To obtain unique assignments for the occupations of the ferromagnetic shims in the shim rails 24, the rails 24 are numbered 20 and the possible shim positions are alphabetically listed 21 in the guiding rails (chambers). This permits production of a matrix for the rails 24 with numbered lines 20 and for chambers with alphabetic gaps 21. This provides for a simple manual allocation of the occupation for the ferromagnetic shims.

Figure 1:
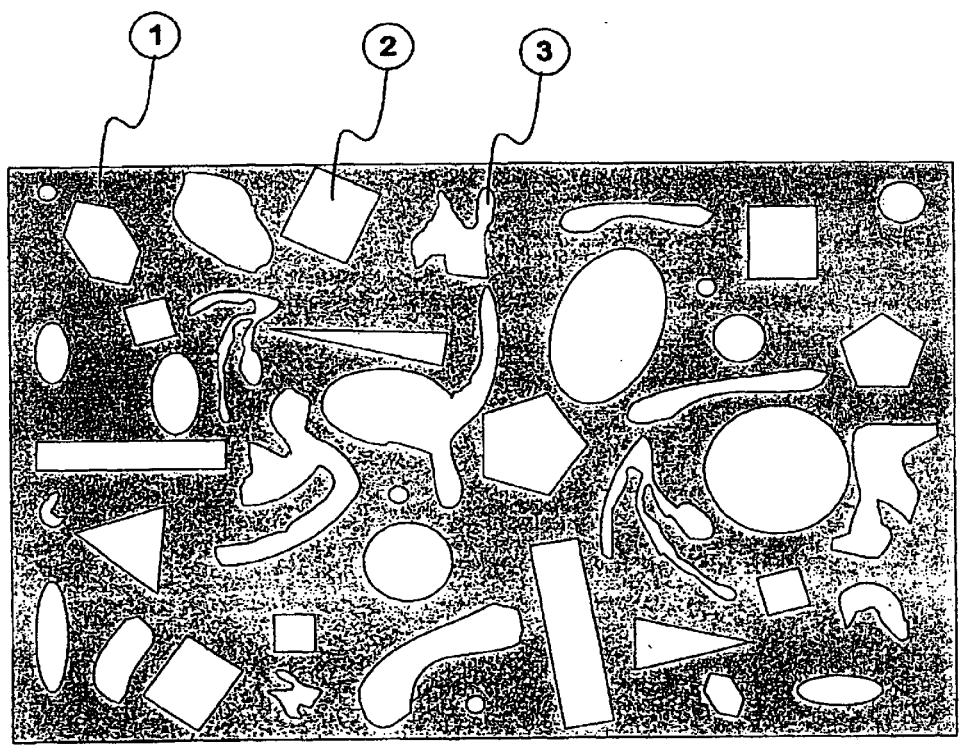
FIG. 1 shows the dependence of an inventive field shaping element with the cut-outs for the desired magnetic field correction.

FIG. 1 shows a schematic planar projection of a field shaping element formed from ferromagnetic sheet metal or foil 1 having field correction openings 2, 3. The openings 2, 3 of the foils 1 and/or sheet metals which are required for magnetic field correction can have geometrically simple shapes, such as squares, circles, triangles, ellipses etc. or can assume very bizarre and complex shapes. They can also comprise a combination of both shape types. These field shaping elements permit optimum utilization of space while simultaneously performing the task of ferromagnetic field shaping elements (shims). Neither a positioning in rails with chambers nor a size and shape of a shim are constrained. The software for determining the cut-outs in the sheet metals and foils can be selected with high resolution to provide more accurate desired field corrections. When a computer-controlled machine tool is used, the calculated openings 2, 3 in the foils 1 and sheet metals are realized with high precision and consequently, the field distortions are eliminated with more accuracy. In contrast to the conventional passive and manual shim method shown in FIG. 6, the desired field correction can always be carried out without occupation error. This illustrates the reliability of this inventive passive field correction method. The openings 2, 3 shown by way of example in FIG. 1 can be cut out from flat ferromagnetic sheet metals or foils 1 or also directly from rolled or deformed ferromagnetic sheet metals, foils or pipes.

Figure 2:
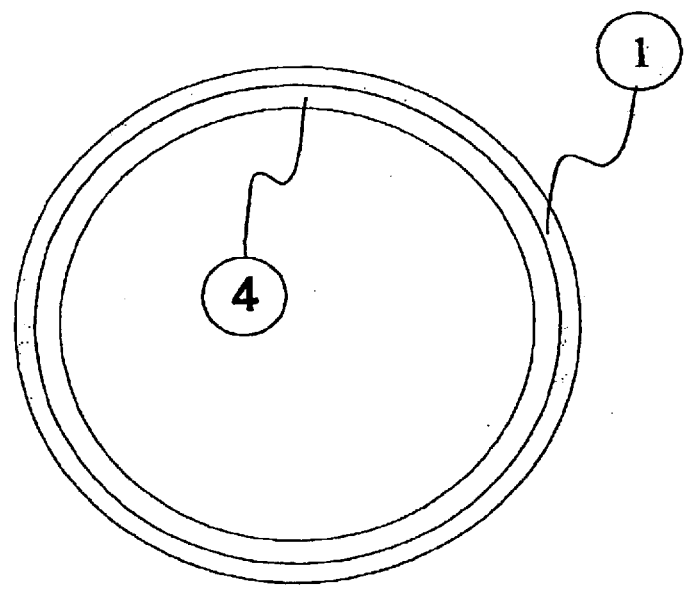
FIG. 2 shows a section through an exemplary arrangement of a ferromagnetic sheet metal or foil.

FIG. 2 shows a section through a possible arrangement of a ferromagnetic sheet metal or foil 1. In this illustration, the ferromagnetic sheet metal or foil 1 is disposed onto a cylindrical support tube 4 and can be easily introduced into the room temperature bore of a nuclear magnetic resonance magnet. The support tube 4 mainly provides mechanical stability to prevent sagging of the thin sheet metals and foils 1 and to mechanically fix them to also produce a defined, reproducible position in the magnet system. Mounting of the sheet metals and foils 1 can be effected e.g. via point welding, position bolts or screws on the support tube 4. When the sheet metals and foils 1 are stable they can be mounted in a self-supporting fashion without support tube 4 or can constitute a ferromagnetic tube. The support tube 4 can be made from different materials, e.g. from non-magnetic steel or plastic material. Support tubes 4 of plastic material also thermally insulate the ferromagnetic sheet metals and foils 1 with respect to the temperature fluctuations prevailing In the room temperature tube. This is particularly advantageous since the field-correcting properties of the ferromagnetic field shaping elements are very sensitive to temperature changes. Temperature fluctuations can be caused e.g. by gradient systems, day and night cycles etc.

Figure 3:
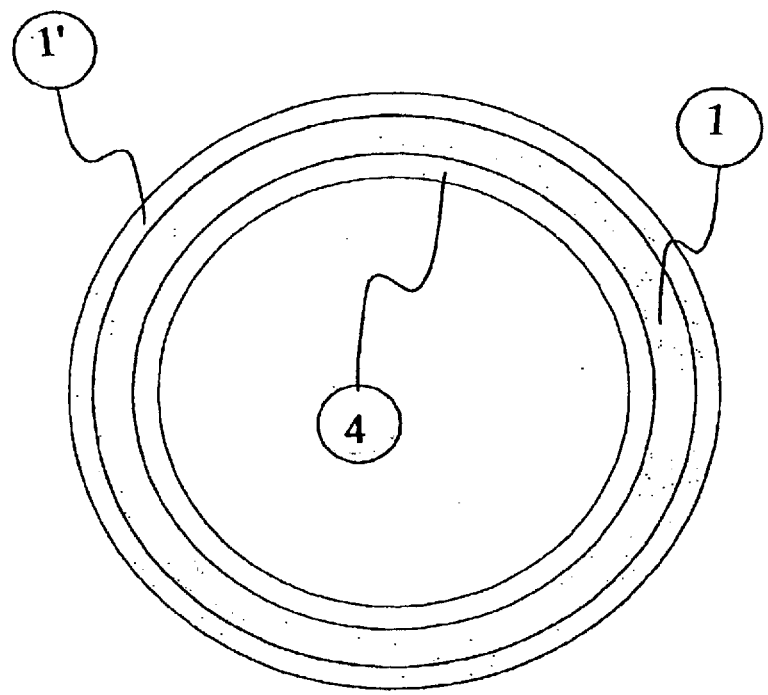
FIG. 3 shows a section through an exemplary arrangement of several nested ferromagnetic sheet metals or foils.

FIG. 3 shows a further possibility for mounting several ferromagnetic sheet metals and foils 1,1'. As described in FIG. 2, they can be mounted to support tubes 4, be self-supporting or be formed into tubes. In case of several nested tubes, sheet metals and foils 1,1', the thicknesses can be varied to permit optimum adaptation of the inventive ferromagnetic sheet metals and foils 1,1'and their openings to the field shapes which are to be corrected.

Figure 4:
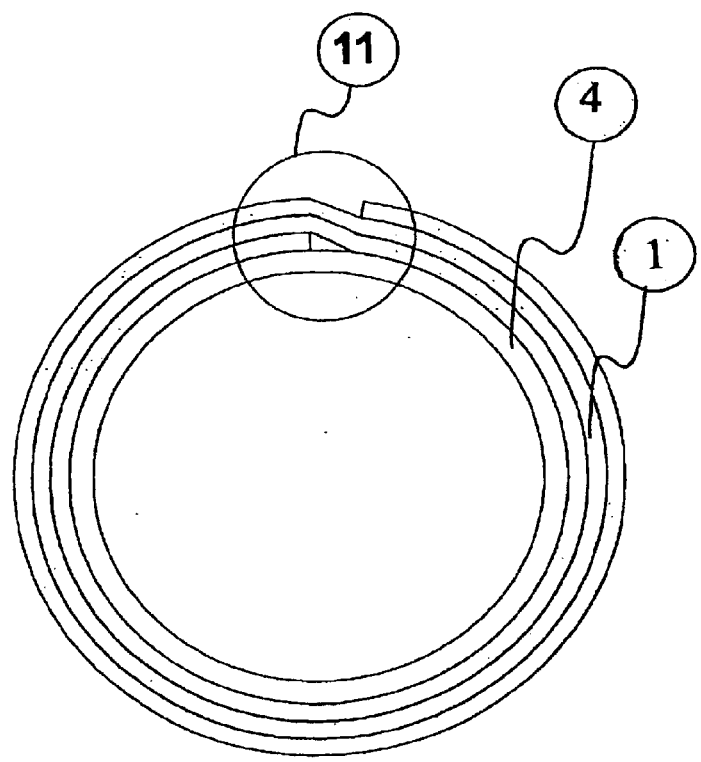
FIG. 4 shows a section through an exemplary arrangement with ferromagnetic sheet metals or foils wound in several layers.

FIG. 4 shows a different form of sheet metal and foil mounting. The foils and sheet metals 1 are wound in several layers, one on top of the other. These can either be self-supporting or on a support tube 4. This method is advantageous in that only two mounting points (beginning and end) are required. The cut-out 11 illustrates the problems with regard to transitions to subsequent layers. This radius increase can be taken into consideration in the software for determining the openings. The sheet metals 1 and foils can be mounted herein as described in FIG. 2.

Figure 5:
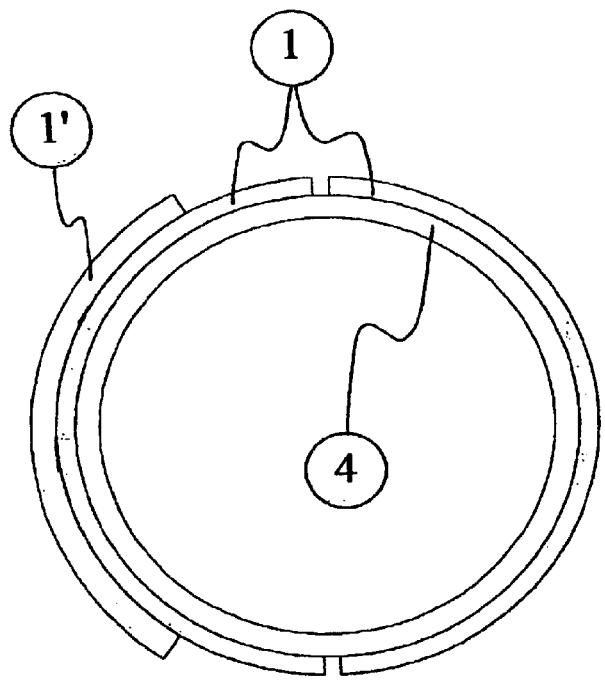
FIG. 5 shows a section through an exemplary arrangement with several segments of cylindrical shells of ferromagnetic sheet metals or foils.

FIG. 5 shows a further variant for mounting the sheet metals and folls wherein the segments of cylindrical shells 1,1' of ferromagnetic sheet metals or foils are used herein. These segments of cylindrical shell 1,1' can have different shapes and thicknesses and are mounted onto a support tube 4. This support tube 4 has the same properties as described in FIG. 2.

Clearly, a further embodiment for mounting the sheet metals and foils comprises one or more combinations of the methods shown in FIGS. 2, 3, 4, 5.

The process for generating the passive field correction, i.e. for generating the desired spatial dependence of a magnetic field using ferromagnetic sheet metals and foils can be subdivided into three main steps. In the first step, the magnetic field profile is measured and detected in a computer-controlled fashion. In the second calculation step, this magnetic field profile data is evaluated via suitable software. The position, shape, and configuration of the required openings in the ferromagnetic sheet metals or foils required for field correction is then determined by an additional software module. In the initially mentioned third "occupation step" which no longer represents occupation with ferromagnetic field shaping elements but rather represents realization of the previously calculated openings, the information determined in the computer is directly (online) passed on to a computer-controlled machine tool. This computer-controlled machine tool could be e.g. a laser or water jet cutting machine. Such a machine tool permits very precise realization of the calculated openings. These machines also have the advantage that they do not produce chips through direct contact by a tool during processing of the sheet metal or foil. The ferromagnetic material is thereby not mechanically stressed or inadvertently deformed. The sheet metals and foils are subsequently rolled or brought into the desired shape and installed into the magnet (unless they are tubular). If the magnetic field correction is insufficient, the entire procedure is repeated until the desired result is obtained. Since all relevant data is detected, evaluated, calculated and realized in a computer-controlled fashion, the risk of errors is very small compared to conventional field correction methods having manual occupation of shim plates. Erroneous occupations by shim plates make conventional field correction processes highly sensitive, unreliable and extremely slow.

I claim:

1. A device for adjusting a spatial dependence of a magnetic field in a working volume of a main field magnet using ferromagnetic field shaping elements, the device comprising:

at least one ferromagnetic toil or sheet metal having openings, said openings having shapes, positions and sizes selected such that a shape and amount of ferromagnetic material remaining in said foil or sheet metal shims the magnetic field in the working volume of the main field magnet, wherein said foil or sheet metal Is self-supporting and surrounds the working volume of the main field magnet.

2. The device of claim 1, wherein the main field magnet is part of a magnetic resonance (MR) apparatus.

3. The device of claim 1, wherein said at least one ferromagnetic foil or sheet metal is disposed on a substantially cylindrical surface surrounding the working volume of the main field magnet.

4. The device of claim 1, further comprising at least one support tube disposed to surround the working volume of the main field magnet, wherein said foil or sheet metal is disposed on said support tube.

5. The device of claim 4, wherein said support tube has a thin wall.

6. The device of claim 1, wherein said foil or sheet metal is bendable.

7. The device of claim 1, wherein said ferromagnetic foil or sheet metal is rolled.

8. The device of claim 1, wherein said ferromagnetic foil or sheet metal has several layers.

9. The device of claim 8, wherein differing layers of said foil or sheet metal are disposed in operational positions thereof around the working volume of the main field magnet such that they can be mutually turned and fixed.

10. The device of claim 1, wherein said foil or sheet metal is formed from segments of cylindrical shells.

11. The device of claim 1, further comprising additional ferromagnetic shim elements disposed, about the working volume of the main field magnet, in rails with guidances, wherein said additional shim elements are formed and positioned to produce, together with said foil or sheet metal, said desired spatial dependence of the magnetic field in the working volume of the main field magnet.

12. The device of claim 11, wherein said rails with said guidances for said shim elements are disposed on a support tube for said foil or sheet metal.

13. The device of claim 11, wherein said rails with said guidances for said shim elements are disposed on said foil or sheet metal.

14. The device of claim 1, wherein only one single field shaping element is provided which is formed in one piece from said foil or sheet metal.

15. The device of claim 1, wherein said openings in said foil or sheet metal, which are required for a desired field correction of the magnetic field generated in the working volume by the main field magnet, are produced from flat foil or sheet metal.

16. The device of claim 1, wherein said openings in said foil or sheet metal, required for a desired field correction of the magnetic field generated in the working volume by the main field magnet, are produced from rolled foil or sheet metal.

* * * * *